US 6,573,771 B2

United States Patent
Lee et al.

(10) Patent No.: US 6,573,771 B2
(45) Date of Patent: Jun. 3, 2003

(54) CLOCK SYNCHRONIZATION CIRCUIT HAVING IMPROVED JITTER PROPERTY

(75) Inventors: Seong-Hoon Lee, Kyoungki-do (KR); Jong Tae Kwak, Kyoungki-do (KR); Chang-Ki Kwon, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/136,304

(22) Filed: May 2, 2002

(65) Prior Publication Data

US 2003/0001635 A1 Jan. 2, 2003

(30) Foreign Application Priority Data

Jun. 29, 2001 (KR) ........................................ 2001-38035

(51) Int. Cl.[7] ................................................ H03L 7/06
(52) U.S. Cl. ...................... 327/158; 327/156; 327/149; 327/270; 327/276
(58) Field of Search ................................. 327/141, 144, 327/146, 147, 156, 158, 269, 270, 271, 276, 277, 284, 393, 395, 396, 398

(56) References Cited

U.S. PATENT DOCUMENTS 5,875,219 A * 2/1999 Kim ............................ 375/376
6,483,359 B2 * 11/2002 Lee ............................. 327/158

* cited by examiner

*Primary Examiner*—Timothy P. Callahan
*Assistant Examiner*—An T. Luu
(74) *Attorney, Agent, or Firm*—Jacobson Holman PLLC

(57) ABSTRACT

A clock synchronization circuit. The clock synchronization circuit composed of a digital DLL outputs a clock signal delayed by a variable delay line and a clock signal delayed by an additional delay cell, mixes the two clock signals, and outputs an internal clock signal having a smaller delay than a delay time of a delay cell, thereby rapidly precisely synchronizing an external clock signal and the internal clock signal. In addition, a driving unit and a control unit for adjusting a duty cycle are provided to set up a ratio of 50%, thereby improving operation performance.

9 Claims, 8 Drawing Sheets

CLOCK SYNCHRONIZATION CIRCUIT HAVING IMPROVED JITTER PROPERTY

BACKGROUND OF THE INVENTION

1. Field of the Invention

The present invention relates to a clock synchronization circuit for a semiconductor memory device, and in particular to a clock synchronization circuit which can improve a jitter property by outputting a clock signal having a phase between phases of two clock signals generated in a digital delay locked loop (DLL) with a predetermined time difference by using a phase mixing unit.

2. Description of the Background Art

In general, a clock synchronization circuit such as a DLL or PLL is used as a clock-generating device for compensating for a skew between an external clock signal and data or between the external clock signal and an internal clock signal.

FIG. 1 is a block diagram illustrating a conventional clock synchronization circuit for a semiconductor memory device. Here, a linear register controlled DLL is exemplified.

The conventional clock synchronization circuit includes: a receiving unit 1 for buffering an external clock signal EXCLK; a variable delay line 2 for delaying a buffered clock signal iCLK from the receiving unit 1, and generating an internal clock signal INCLK; a delay monitor 3 for monitoring a delay time of the internal clock signal INCLK from the variable delay line 2; a phase detector 4 for comparing a phase difference between the buffered clock signal iCLK and the internal clock signal INCLK, and outputting the results SHL and SHR; and a shift register 5 for controlling the delay time of the variable delay line 2 according to the output signals SHL and SHR from the phase detector 4.

The buffered clock signal iCLK obtained by buffering the external clock signal EXCLK is delayed by the variable delay line 2 for a predetermined time, and then outputted as the internal clock signal INCLK.

The internal clock signal INCLK is inputted to the phase detector 4 through the delay monitor 3, so that the phase detector 4 judges whether the internal clock signal INCLK has a faster or slower phase than the buffered clock signal iCLK.

The phase detector 4 controls the shift register 5 so that the buffered clock signal iCLK and the internal clock signal INCLK have the same phase, and controls the variable delay line 2 to delay the buffered clock signal iCLK for a predetermined time.

FIG. 2 is a detailed circuit diagram illustrating the variable delay line 2 of the clock synchronization circuit of FIG. 1.

The variable delay line 2 includes: NAND gates ND1-NDN for selectively outputting the buffered clock signal iCLK according to output signals SL1-SLN from the shift register 5; unit delay cells DEL1-DELN connected in series for delaying the buffered clock signal iCLK selectively outputted by the NAND gates ND1-NDN; and a NAND gate NDA having its one terminal connected to receive a power voltage VCC and its other terminal connected to receive the output signal from the last unit delay cell DELN, and outputting the internal clock signal INCLK.

The unit delay cell DELN includes: a NAND gate ND1N having its one input terminal connected to receive the output signal from the previous unit delay cell DEL(N−1) and its other input terminal connected to receive the output signal from the NAND gate ND1; a NAND gate ND2N having its one input terminal connected to receive the power voltage VCC and its other input terminal connected to receive the output signal from the NAND gate ND1N. Here, the other unit delay cells DEL1-DEL(N−1) have the same constitution as the unit delay cell DELN.

The operation of the conventional clock synchronization circuit will now be explained.

When it is presumed that the second signal of the output signals SL1-SLN from the shift register 5 has a high level and the other signals SL1 and SL3-SLN have a low level in an early stage, the buffered clock signal iCLK is delayed through a delay path from the second delay cell DEL2 to the last delay cell DELN, and outputted as the internal clock signal INCLK.

Here, the phase detector 4 compares the phase of the buffered clock signal iCLK with the phase of the internal clock signal INCLK. When the phase of the buffered clock signal iCLK is faster than that of the internal clock signal INCLK, the phase detector 4 outputs the control signal SHL to shift left the shift register 5.

That is, since the second signal SL2 of the output signals SL1-SLN from the shift register 5 has a high level and the other signals SL1 and SL3-SLN have a low level in the early stage, the first signal SL1 of the output signals SL1-SLN from the shift register 5 has a high level and the other signals SL2-SLN have a low level according to the control signal SHL from the phase detector 4. Accordingly, the buffered clock signal iCLK is delayed through a delay path from the first delay cell DEL1 to the last delay cell DELN, and outputted as the internal clock signal INCLK.

Conversely, when the phase detector 4 compares the phase of the buffered clock signal iCLK with the phase of the internal clock signal INCLK, if the phase of the buffered clock signal iCLK is slower than the phase of the internal clock signal INCLK, the phase detector 4 outputs the control signal SHR to shift the shift register 5 to the right.

Since the second signal SL2 of the output signals SL1-SLN from the shift register 5 has a high level and the other signals SL1 and SL3-SLN have a low level in the early stage, the third signal SL3 of the output signals SL1-SLN from the shift register 5 has a high level and the other signals SL1, SL2 and SL4-SLN have a low level according to the control signal SHR from the phase detector 4. Therefore, the buffered clock signal iCLK is delayed through a delay path from the third delay cell DEL3 to the last delay cell DELN, and outputted as the internal clock signal INCLK.

In a conventional clock synchronization circuit for a semiconductor memory device, the variable delay line 2 has the unit delay cells DELI connected in series and each unit delay cell has serially-connected NAND gates ND11 and ND21.

Accordingly, a number of the unit delay cells DELI is increased or decreased to adjust a delay time. The minimum time unit of the delay time are the delay time of one unit delay cell DEL1. As a result, a precise delay cannot be performed in a smaller unit than the delay time of the unit delay cell DEL1.

SUMMARY OF THE INVENTION

Accordingly, it is a primary object of the present invention to improve a jitter property by adjusting a delay ratio in a clock synchronization circuit composed of a digital DLL.

Another object of the present invention is to improve operation and performance by controlling the duty cycle of an internal clock signal.

In order to achieve the above-described objects of the invention, there is provided a clock synchronization circuit for a semiconductor memory device including: a clock synchronization control means for outputting a normal delay clock signal by delaying an external clock signal for a predetermined time, and outputting an additional delay clock signal by delaying the normal delay clock signal; a phase mixing means for mixing phases of the normal delay clock signal and the additional delay clock signal from the clock synchronization control means, and outputting an internal clock signal; a control means for controlling the operation of the phase mixing means, and determining a phase of the internal clock signal; a shift register for controlling a delay time of the clock synchronization means; and a phase detecting means for comparing a phase of the external clock signal with a phase of the internal clock signal, and controlling the shift register to equalize the phases of the external clock signal and the internal clock signal.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A clock synchronization circuit in accordance with preferred embodiments of the present invention will now be described in detail with reference to the accompanying drawings.

Figure 1:
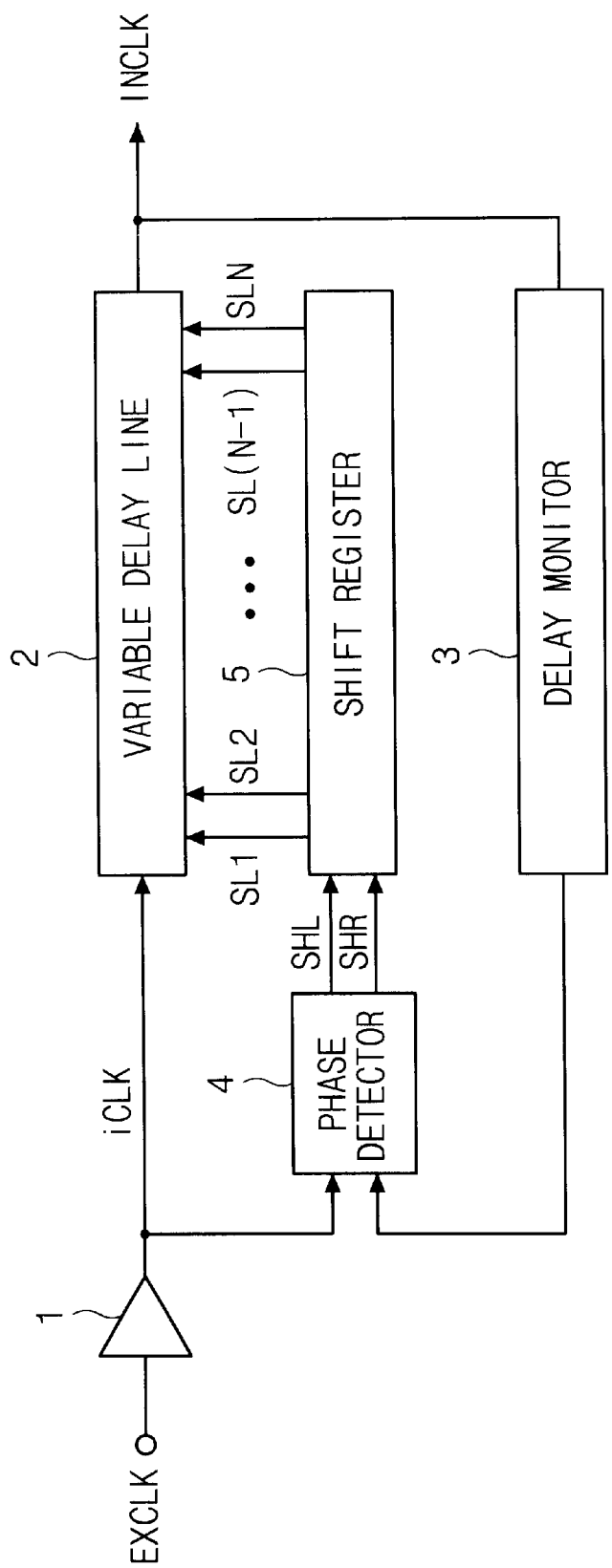
FIG. 1 is a block diagram illustrating a conventional clock synchronization circuit.
Figure 2:
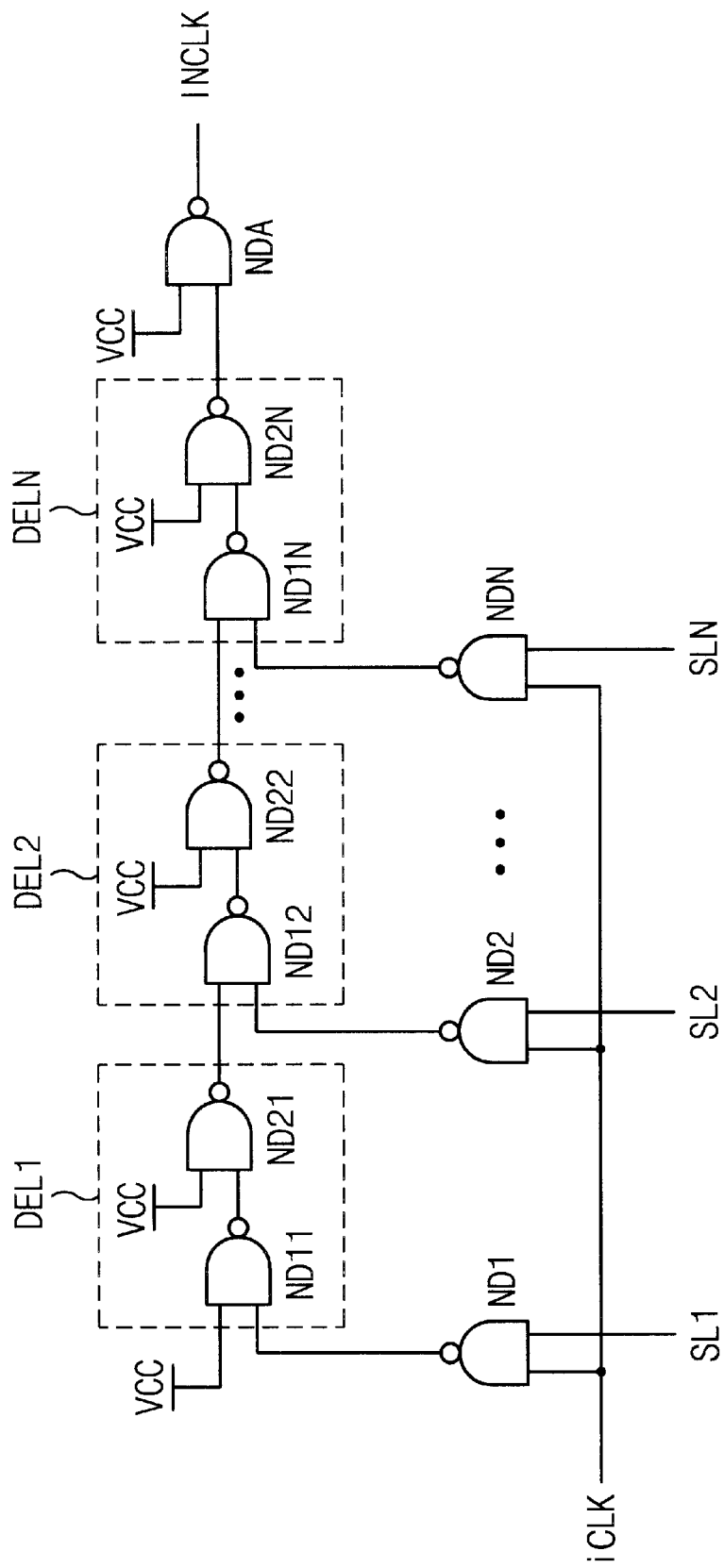
FIG. 2 is a detailed circuit diagram illustrating a variable delay line of FIG. 1.
Figure 3:
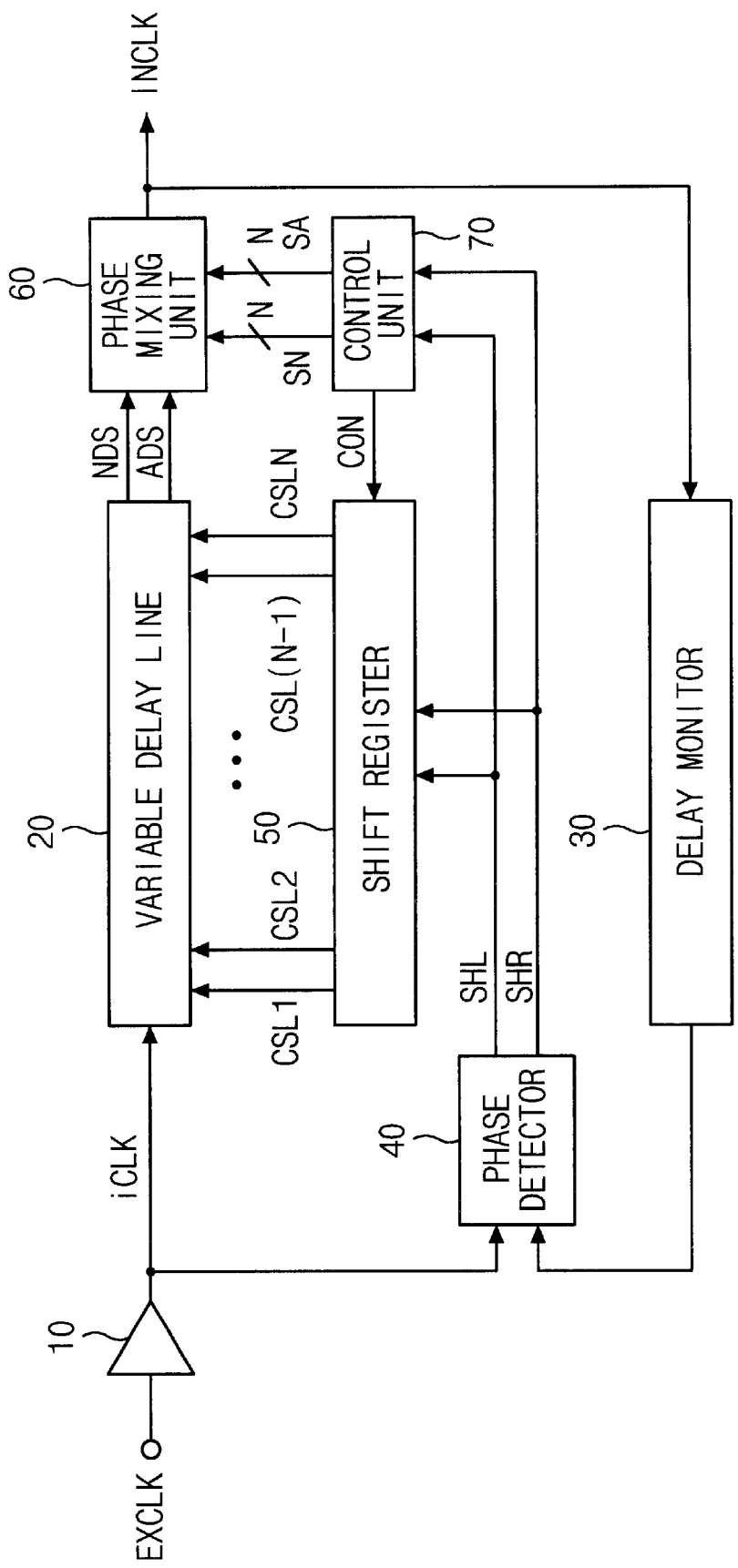
FIG. 3 is a block diagram illustrating a clock synchronization circuit in accordance with a preferred embodiment of the present invention.

FIG. 3 is a block diagram illustrating the clock synchronization circuit in accordance with the present invention. Here, a digital register controlled DLL is used as an example.

The clock synchronization circuit includes: a receiving unit 10; a variable delay line 20; a delay monitor 30; a phase detecting unit 40; a shift register 50; a phase mixing unit 60; and a control unit 70.

Here, the receiving unit 10 buffers an external clock signal EXCLK, and outputs a buffered clock signal iCLK.

The variable delay line 20 outputs a normal delay clock signal NDS by delaying the buffered clock signal iCLK for a predetermined time, and outputs an additional delay clock signal ADS by delaying the normal delay clock signal NDS for a predetermined time DL.

The phase mixing unit 60 mixes phases of the normal delay clock signal NDS and the additional delay clock signal ADS from the variable delay line 20, and outputs an internal clock signal INCLK having a phase between the phases of the two clock signals NDS and ADS.

The control unit 70 outputs control signals SN1-SNN and SA1-SAN to control the operation of the phase mixing unit 60. Here, the control unit 70 sets up the control signals SN1-SNN and SA1-SAN so that the internal clock signal INCLK has a phase between the phase of the normal delay clock signal NDS and the phase of the additional delay clock signal ADS.

Figure 4:
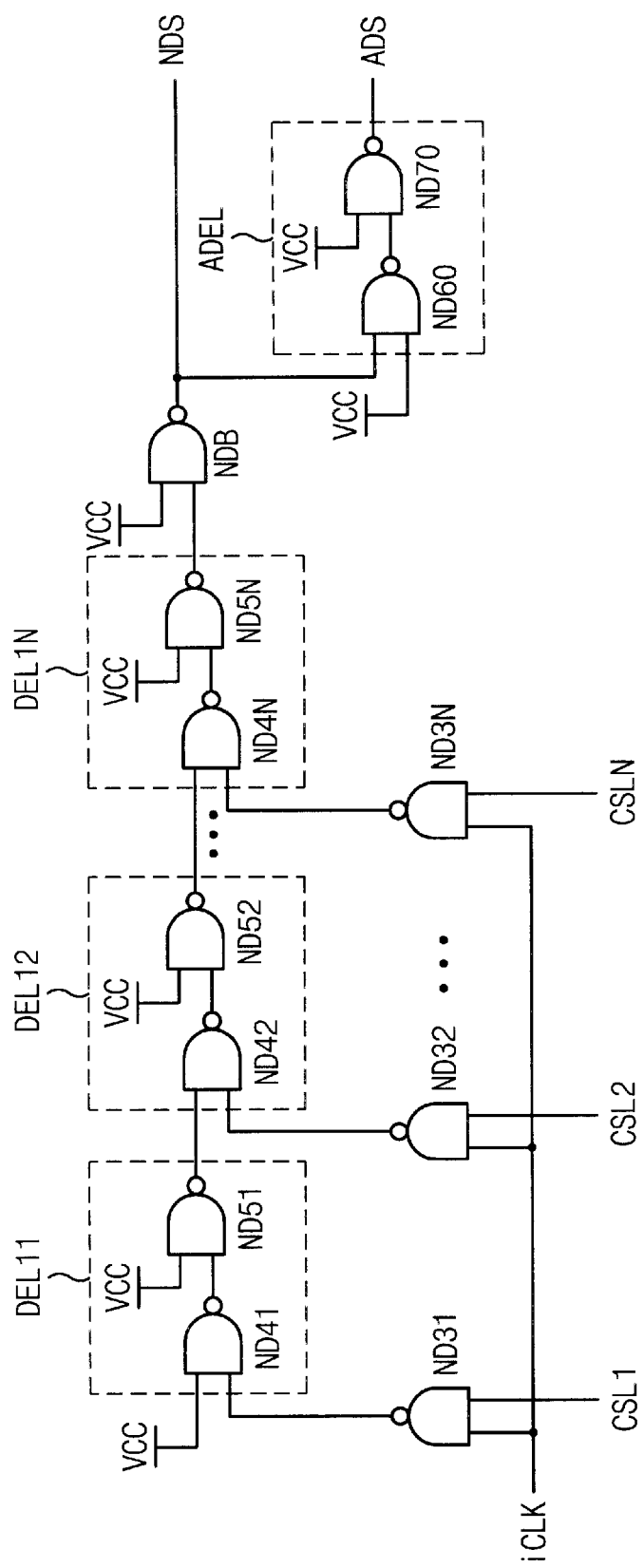
FIG. 4 is a detailed circuit diagram illustrating a variable delay line of FIG. 3.

FIG. 4 is a detailed circuit diagram illustrating the variable delay line 20 of the clock synchronization circuit in accordance with the present invention.

The variable delay line 20 includes: NAND gates ND31-ND3N for selectively outputting the buffered clock signal iCLK according to output signals CSL1-CSLN from the shift register 50; unit delay cells DEL1-DELN connected in series for delaying the buffered clock signal iCLK selectively outputted by the NAND gates ND31-ND3N; a NAND gate NDB having its one input terminal connected to receive a power voltage VCC and its other input terminal connected to receive the output signal from the unit delay cell DELN, and outputting the normal delay clock signal NDS; and an additional delay cell ADEL for delaying the normal delay clock signal NDS for a predetermined time DL, and outputting the additional delay clock signal ADS.

Here, the unit delay cell DEL1N includes: a NAND gate ND4N having its one input terminal connected to receive the output signal from the previous unit delay cell DEL1(N−1), and its other input terminal connected to receive the output signal from the NAND gate ND31; a NAND gate ND5N having its one input terminal connected to receive the power voltage VCC and its other input terminal connected to receive the output signal from the NAND gate ND4N. Here, the other unit delay cells DEL11-DEL1(N−1) have the same constitution as the unit delay cell DEL1N.

The additional delay cell ADEL includes: a NAND gate ND60 having its one input terminal connected to receive the power voltage, and its other input terminal connected to receive the normal delay clock signal NDS; and a NAND gate ND70 having its one input terminal connected to receive the power voltage VCC and its other input terminal connected to receive the output signal from the NAND gate ND60, and outputting the additional delay clock signal ADS. Here, the additional delay cell ADEL has the same constitution as the unit delay cells DEL11-DEL1N, and thus has the same unit delay time.

Figure 5:
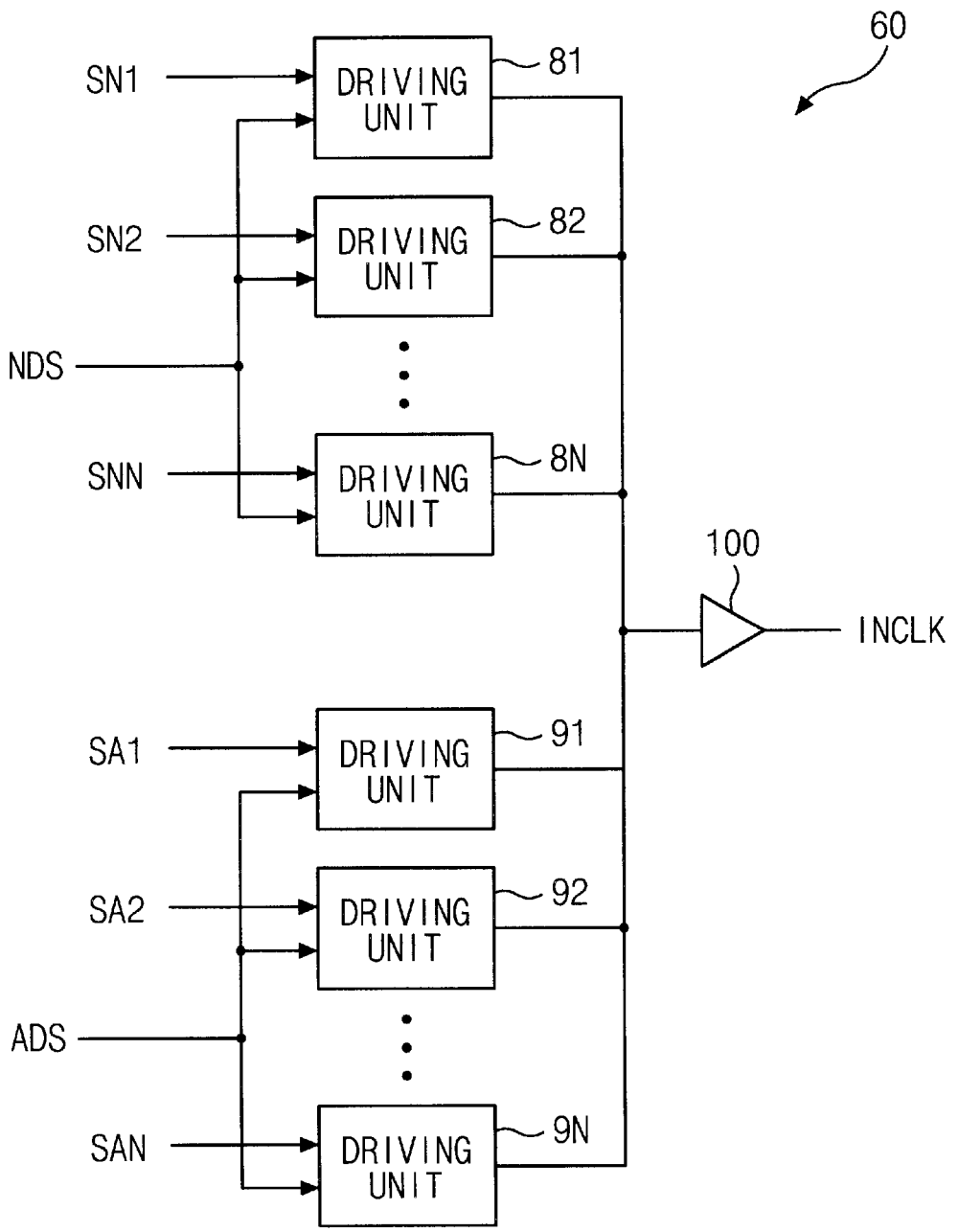
FIG. 5 is a detailed circuit diagram illustrating a phase mixing unit of FIG. 3.

FIG. 5 is a detailed circuit diagram illustrating the phase mixing unit 60.

The phase mixing unit 60 includes: driving units 81-8N for selectively driving the normal delay clock signal NDS according to the control signals SN1-SNN; driving units 91-9N for selectively driving the additional delay clock signal ADS according to the control signals SA1-SAN; and a mixing unit 100 for mixing the signals driven by the driving units 81-8N and 91-9N, and outputting the internal clock signal INCLK.

Figure 6:
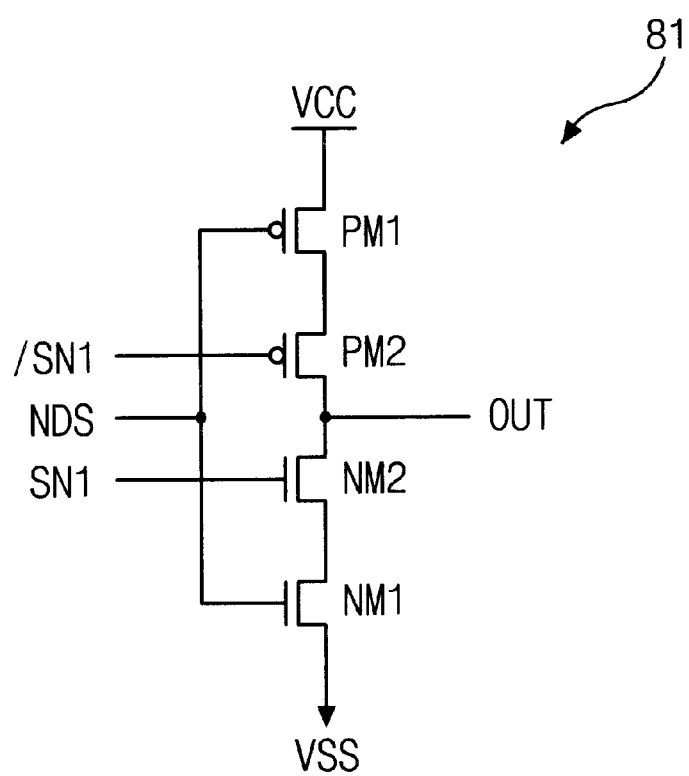
FIG. 6 is a detailed circuit diagram illustrating a driving unit of FIG. 5.
Figure 7:
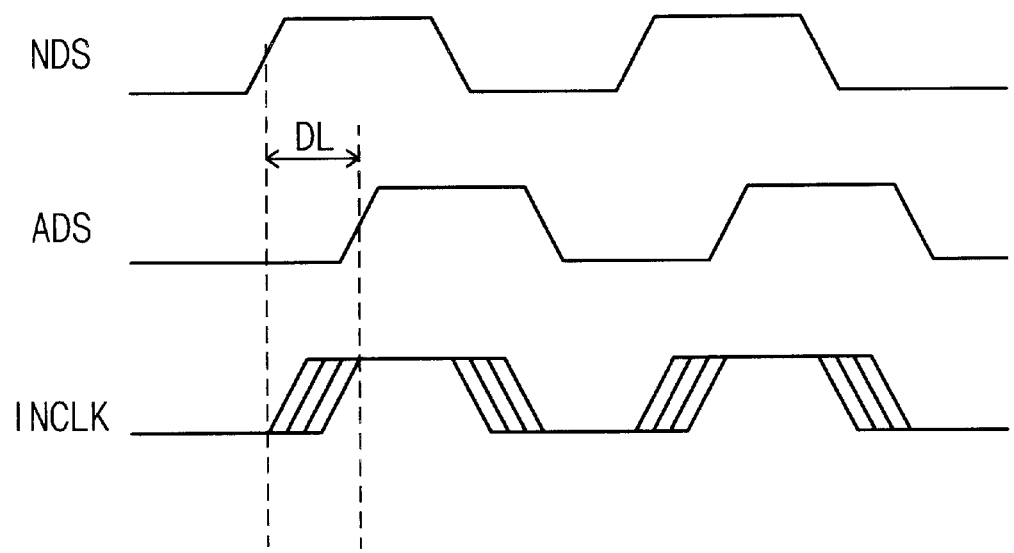
FIG. 7 is a timing diagram of the operation of a phase mixing unit of FIG. 5.

FIG. 6 is a detailed circuit diagram illustrating the driving unit 81 of the phase mixing unit 60.

The driving unit 81 includes: a PMOS transistor PM1 and an NMOS transistor NM1 being connected in series between the power voltage VCC and a ground voltage VSS, and having their gates connected to receive the normal delay clock signal NDS; and an NMOS transistor NM2 and a PMOS transistor PM2 having their gates connected to receive the control signals SN and /SN1, commonly-connected drains of the NMOS transistor NM2 and the PMOS transistor PM2 composing an output terminal OUT. Here, the other driving units 82-8N and 91-9N have the same constitution as the driving unit 81.

Here, the control signals SN1-SNN are used to control driving of the normal delay control signal NDS, and the control signals SA1-SAN are used to control driving of the additional delay clock signal ADS.

The operation of the clock synchronization circuit in accordance with the present invention will now be explained.

When it is presumed that the second signal of the output signals CSL1-CSLN from the shift register 50 is at a high level and the other signals CSL1 and CSL3-CSLN are at a low level in an early stage, the buffered clock signal iCLK is delayed through a delay path from the second delay cell DEL12 to the last delay cell DEL1N to output the normal delay clock signal NDS to the phase mixing unit 60, and the normal delay clock signal NDS is delayed through the additional delay cell ADEL for a predetermined time DL to output the additional delay clock signal ADS to the phase mixing unit 60.

Here, the phase mixing unit 60 outputs the internal clock signal INCLK having a phase between the phases of the normal delay clock signal NDS and the additional delay clock signal ADS according to the control signals SN1-SNN and SA1-SAN from the control unit 70.

A phase difference between the normal delay clock signal NDS and the additional delay clock signal ADS is the delay time of the additional delay cell ADEL. Since the additional delay cell ADEL has the same delay time as the unit delay cells DEL11-DEL1N, the phase difference is as long as the delay time of the unit delay cells DEL11-DEL1N.

Accordingly, the control unit 70 outputs the control signals SN1-SNN and SA1-SAN to determine the phase of the internal clock signal INCLK from the phase mixing unit 60 to approximate the phase of the normal delay clock signal NDS or the phase of the additional delay clock signal ADS, and then outputs the internal clock signal INCLK having a phase between the phases of the two input signals NDS and ADS.

Here, the operation of the phase mixing unit 60 is defined by the following Formula 1:

$$INCLK = NDS \times (1-\alpha) + ADS \times \alpha \quad \text{(formula 1)}$$

Here, '$\alpha$' is determined by the control signals SN1-SNN and SA1-SAN from the control unit 70. When '$\alpha$' is increased, the internal clock signal INCLK has a phase approximately equal to the phase of the additional delay clock signal ADS. When '$\alpha$' is decreased, the internal clock signal INCLK has a phase approximately equal to the phase of the normal delay clock signal NDS.

The operation of the clock synchronization circuit, when the phase of the buffered clock signal iCLK is faster than that of the internal clock signal INCLK, will now be explained.

Initially, '$\alpha$' is set up to be zero (0) in Formula 1. That is, all of the whole control signals SN1-SNN are at a high level, thereby enabling all the driving units 81-8N to drive the normal delay clock signal NDS, and the whole control signals SA1-SAN have a low level, thereby disabling all the driving units 91-9N to drive the additional delay clock signal ADS.

Therefore, the phase mixing unit 60 outputs the internal clock signal INCLK having the same phase as the normal delay clock signal NDS.

This condition is maintained until the phase of the internal clock signal INCLK is approximate to the phase of the buffered clock signal iCLK to some extent.

Thereafter, when the phase of the internal clock signal INCLK is approximately equal to the phase of the buffered clock signal iCLK to some extent, '$\alpha$' is gradually increased in Formula 1, so that the phase of the internal clock signal INCLK can be approximately equal to the phase of the additional delay clock signal ADS.

That is, the number of the enabled driving units 81-8N for driving the normal delay clock signal NDS is reduced according to the control signals SN1-SNN from the control unit 70, and the number of the enabled driving units 91-9N for driving the additional delay clock signal ADS is increased according to the control signals SA1-SAN.

The internal clock signal INCLK is outputted with the minutely-increased phase.

The procedure is repeated until the phase of the internal clock signal INCLK is identical to the phase of the buffered clock signal iCLK.

In a situation where (1) the driving units 81-8N for driving the normal delay clock signal NDS are all disabled; (2) the driving units 91-9N for driving the additional delay clock signal ADS are all enabled according to the control signals SN1-SNN and SA1-SAN from the control unit 70; (3) the phase of the internal clock signal INCLK is identical to the phase of the additional delay clock signal ADS; and (4) the phase of the internal clock signal INCLK is still faster than that of the buffered clock signal iCLK, the control unit 70 outputs a control signal CON to shift the shift register 50 to the left. Accordingly, the first control signal CSL1 is at a high level and the other control signals CSL2-CSLN are at a low level to form a delay path from the first unit delay cell DEL12 to the last unit delay cell DEL1N, thereby newly outputting the normal delay clock signal NDS and the additional delay clock signal ADS.

Thereafter, the number of the driving units 81-8N for driving the normal delay clock signal NDS and the number of the driving units 91-9N for driving the additional delay clock signal ADS are adjusted according to the control signals SN1-SNN and SA1-SAN from the control unit 70. That is, the internal clock signal INCLK is outputted with the minutely-controlled phase. Such a procedure is repeated until the phase of the internal clock signal INCLK is identical to the phase of the buffered clock signal iCLK.

Conversely, when the phase of the buffered clock signal iCLK is slower than that of the internal clock signal INCLK, '$\alpha$' is set up to be one (1) in Formula 1 in an early stage, and thus the internal clock signal INCLK has the same phase as the additional delay clock signal ADS.

This condition is maintained until the phase of the internal clock signal INCLK is approximately equal to the phase of the buffered clock signal iCLK to some extent.

Thereafter, when the phase of the internal clock signal INCLK is approximately equal to the phase of the buffered clock signal iCLK to some extent, '$\alpha$' is gradually decreased in Formula 1, so that the phase of the internal clock signal INCLK can be approximately equal to the phase of the normal delay clock signal NDS.

That is, the number of the enabled driving units 81-8N for driving the normal delay clock signal NDS is increased according to the control signals SN1-SNN from the control unit 70, and the number of the enabled driving units 91-9N for driving the additional delay clock signal ADS is decreased according to the control signals SA1-SAN.

The internal clock signal INCLK is outputted with the minutely-decreased phase.

The procedure is repeated until the phase of the internal clock signal INCLK is identical to the phase of the buffered clock signal iCLK.

When the driving units 81-8N, for driving the normal delay clock signal NDS, are all enabled and the driving units 91-9N, for driving the additional delay clock signal ADS, are all disabled according to the control signals SN1-SNN and SA1-SAN from the control unit 70, and the phase of the internal clock signal INCLK is identical to the phase of the normal delay clock signal NDS, if the phase of the internal clock signal INCLK is still slower than that of the buffered clock signal iCLK, the control unit 70 outputs the control signal CON to shift the shift register 50 to the right. Accordingly, the third control signal CSL3 is at a high level and the other control signals CSL1, CSL2 and CSL4-CSLN are at a low level to form a delay path from the third unit delay cell DEL13 to the last unit delay cell DEL1N, thereby newly outputting the normal delay clock signal NDS and the additional delay clock signal ADS.

Thereafter, the number of the driving units 81-8N for driving the normal delay clock signal NDS and the number of the driving units 91-9N for driving the additional delay clock signal ADS are adjusted according to the control signals SN1-SNN and SA1-SAN from the control unit 70. That is, the internal clock signal INCLK is outputted with the minutely-controlled phase. Such a procedure is repeated until the phase of the internal clock signal INCLK is identical to the phase of the buffered clock signal iCLK.

Figure 8:
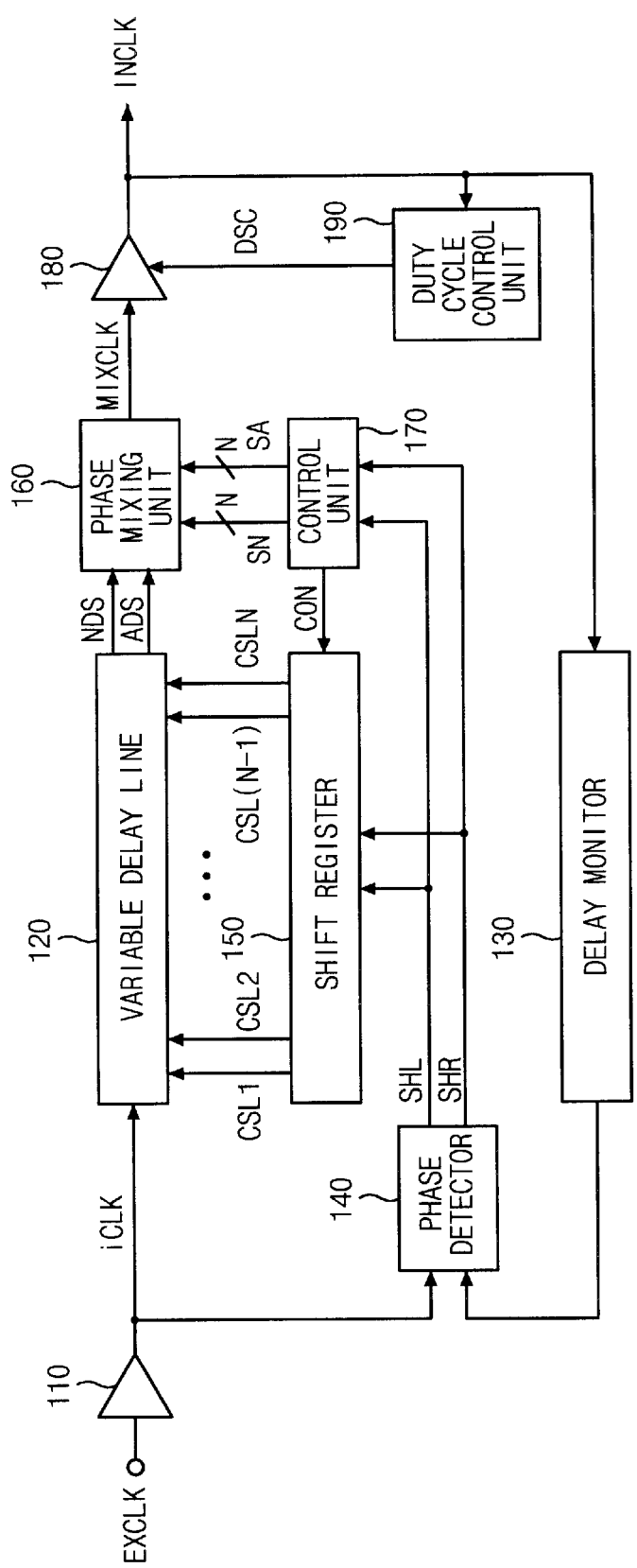
FIG. 8 is a block diagram illustrating a clock synchronization circuit in accordance with another embodiment of the present invention.

FIG. 8 is a block diagram illustrating a clock synchronization circuit for a semiconductor memory device in accordance with another embodiment of the present invention.

The clock synchronization circuit includes: a receiving unit 110; a variable delay line 120; a delay monitor 130; a phase detecting unit 140; a shift register 150; a phase mixing unit 160; and a control unit 170. The clock synchronization circuit further includes: a duty driving unit 180 for setting up a level ratio of a mix clock signal MIXCLK from the phase mixing unit 160; and a duty cycle control unit 190 for controlling the ratio of the duty driving unit 180.

The duty driving unit 180 sets up an identical time duration ratio in the high level period and the low level period of the mix clock signal MIXCLK from the phase mixing unit 160 according to a control signal DSC from the duty cycle control unit 190. That is, the duty driving unit 180 is driven so that the duty of the duty cycle of the internal clock signal INCLK can be 50%.

For example, when the internal clock signal INCLK has a frequency of 500 MHz, if a period of one clock is 2 ns and the duty of the duty cycle is exactly 50%, the high level period and the low level period of the internal clock signal INCLK are 1 ns, respectively.

The duty cycle is adjusted because the DDR SRAM is operated both in a rising edge and a falling edge of the clock signal.

Except for the above-described operation, the clock synchronization circuit of the second embodiment is operated in the same manner as the clock synchronization circuit of the first embodiment, and thus detailed explanations thereof will be omitted.

As discussed earlier, in accordance with the present invention, the clock synchronization circuit composed of the digital DLL outputs the clock signal delayed by the variable delay line and the clock signal delayed by the additional delay cell, mixes the two clock signals, and outputs the internal clock signal having a smaller delay than the delay time of the delay cell, thereby rapidly precisely synchronizing the external clock signal and the internal clock signal.

Moreover, the driving unit and the control unit for adjusting the duty cycle are provided to set up a ratio of 50%, thereby improving the operation performance.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A clock synchronization circuit receiving an external clock signal, the clock synchronization comprising:
    a clock synchronization control means for outputting a normal delay clock signal by delaying the external clock signal for a predetermined time, and outputting an additional delay clock signal by delaying the normal delay clock signal;
    a phase mixing means for mixing phases of the normal delay clock signal and the additional delay clock signal from the clock synchronization control means, and outputting an internal clock signal;
    a control means for controlling the operation of the phase mixing means, and determining a phase of the internal clock signal;
    a shift register for controlling a delay time of the clock synchronization means; and
    a phase detecting means for comparing a phase of the external clock signal with a phase of the internal clock signal, and controlling the shift register to equalize the phases of the external clock signal and the internal clock signal.

2. The circuit according to claim 1, wherein the clock synchronization control means comprises:
    a plurality of select output means for selectively outputting the external clock signal according to a plurality of output signals from the shift register;
    a plurality of unit delay cells connected in series for delaying the external clock signal selectively outputted by the select output means;
    an output driving means having an input terminal connected to receive a power voltage and its other input terminal connected to receive the output signal from the last unit delay cell, and outputting the normal delay output signal; and
    an additional delay cell for delaying the normal delay output signal for a predetermined time, and outputting the additional delay clock signal.

3. The circuit according to claim 2, wherein the unit delay cell comprises:
    a first delay device having a first input terminal connected to receive the output signal from the previous unit delay cell, and a second input terminal connected to receive the external clock signal selectively outputted by the corresponding select output means; and
    a second delay device having a first input terminal connected to receive the power voltage, and a second input terminal connected to receive the output signal from the first delay device.

4. The circuit according to claim 2, wherein the additional delay cell comprises:

a first additional delay device having a first input terminal connected to receive the power voltage, and a second input terminal connected to receive the normal delay clock signal; and a second additional delay device having a first input terminal connected to receive the power voltage and a second input terminal connected to receive the output signal from the first additional delay device, and outputting the additional delay clock signal.

5. The circuit according to claim 2, wherein the additional delay cell has the same structure as the unit delay cell, and thus has the same unit delay time.

6. The circuit according to claim 1, wherein the phase mixing means comprises:

a plurality of normal driving means for selectively driving the normal delay clock signal according to the control signal from the control means;

a plurality of additional driving means for selectively driving the additional delay clock signal according to the control signal from the control means; and a clock mixing means for mixing the signals driven by the normal driving means and the additional driving means, and outputting the internal clock signal.

7. The circuit according to claim 6, receiving a power voltage and a ground voltage, wherein the normal driving means comprises:

a first PMOS transistor and a first NMOS transistor being connected in series between the power voltage and ground voltage, and having their gates connected to receive the normal delay clock signal; and a second PMOS transistor and a second NMOS transistor having their gates connected to receive the corresponding control signal from the control means, commonly-connected drains of the second PMOS transistor and the second NMOS transistor composing an output terminal.

8. The circuit according to claim 6, receiving a power voltage and a ground voltage, wherein the additional driving means comprises:

a first PMOS transistor and a first NMOS transistor being connected in series between the power voltage and ground voltage, and having their gates connected to receive the additional delay clock signal; and a second PMOS transistor and a second NMOS transistor having their gates connected to receive the corresponding control signal from the control means, commonly-connected drains of the second PMOS transistor and the second NMOS transistor composing an output terminal.

9. The circuit according to claim 1, further comprising:

a duty cycle driving means for driving the internal clock signal, and adjusting a duty cycle; and a control means for detecting a duty cycle of the output signal from the duty cycle driving means, and controlling the duty cycle driving means to have a previously-set duty cycle.

* * * * *